(12) United States Patent
Yan et al.

(10) Patent No.: US 6,819,914 B2
(45) Date of Patent: Nov. 16, 2004

(54) DIFFERENTIAL MIXER INJECTION WITH OPTIONAL STEP GAIN CONTROL

(75) Inventors: Kelvin Kai Tuan Yan, High Point, NC (US); Kihong Kim, Greensboro, NC (US); Luke Joseph, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 478 days.

(21) Appl. No.: 10/072,374

(22) Filed: Feb. 7, 2002

(65) Prior Publication Data

US 2003/0148751 A1 Aug. 7, 2003

(51) Int. Cl.[7] ................................................ H04B 1/26
(52) U.S. Cl. .................... 455/318; 455/130; 455/311; 455/333
(58) Field of Search ................................ 455/327, 319, 455/333, 341, 325, 326, 63.1, 552.1, 76, 311, 130, 131, 318; 330/295, 296, 124 R, 127, 132, 133, 134

(56) References Cited

U.S. PATENT DOCUMENTS

| | | | | |
|---|---|---|---|---|
| 4,058,771 A | * | 11/1977 | Ohsawa et al. | 455/332 |
| 4,194,158 A | * | 3/1980 | Tanabe et al. | 455/333 |
| 4,369,522 A | * | 1/1983 | Cerny et al. | 455/333 |
| 6,026,286 A | * | 2/2000 | Long | 455/327 |
| 6,057,714 A | * | 5/2000 | Andrys et al. | 327/105 |
| 6,249,190 B1 | * | 6/2001 | Rozenblit et al. | 331/46 |
| 6,275,687 B1 | * | 8/2001 | Lloyd | 455/292 |
| 6,393,267 B1 | * | 5/2002 | Trask | 455/326 |
| 6,400,936 B1 | * | 6/2002 | Trask | 455/326 |

OTHER PUBLICATIONS

Long, John R., "A Low–Voltage 5.1–5.8–GHz Image–Reject Downconverter RF IC," IEEE Journal of Solid–State Circuits, vol. 35, No. 9, Sep. 2000, pp. 1320–1328.

Zhou, Jianjun J. and Allstot, David J., "Monolithic Transformers and Their Application in a Differential CMOS RF Low–Noise Amplifier," IEEE Journal of Solid–State Circuits, vol. 33, No. 12, Dec. 1998, pp. 2020–2027.

* cited by examiner

Primary Examiner—Sonny Trinh
(74) Attorney, Agent, or Firm—Withrow & Terranova PLLC

(57) ABSTRACT

A differential RF input signal drives the plus and minus terminals of a center tapped primary winding, which couples the differential RF input signal to the plus and minus terminals of a center tapped secondary winding. From the secondary winding, the coupled, differential RF signal drives a double-balanced mixer core operating in response to a differential local oscillator signal. The output of the mixer core is a differential IF signal representative of the differential RF input signal down-converted at the local oscillator frequency. A step reduction in gain associated with the RF input signal may be implemented using bypass circuitry coupled across the primary of the transformer, wherein a relatively small resistance or impedance is coupled across the primary to effectively reduce the load of the differential amplifiers driving the primary.

28 Claims, 4 Drawing Sheets

DIFFERENTIAL MIXER INJECTION WITH OPTIONAL STEP GAIN CONTROL

FIELD OF THE INVENTION

The present invention relates to wireless communications, and in particular to a fully differential front end receiver architecture providing broadband performance.

BACKGROUND OF THE INVENTION

Receiver front ends for wireless communication systems typically require a low noise amplifier (LNA) followed by a double-balanced mixer to pre-amplify incoming signals and subsequently down-convert those signals to an appropriate intermediate frequency (IF). Due to ever-present competitive concerns, there is a need to provide high performance and competitive pricing. Product cost is directly proportional to the number of components necessary to implement a design, and given the need to provide circuitry capable of performing over various frequency bands and in different modes, the ability to provide architectures capable of supporting multiple frequency bands without requiring redundant circuit elements for each band significantly reduces overall cost.

Unfortunately, providing architectures capable of performing over multiple frequency bands often requires more expensive components to maintain performance levels over a broad frequency range. Further, operation over multiple modes often subjects receiver circuitry to varying input signal levels, which often results in poor performance or distortion. Previous mixing circuits suffer from poor second-order intermodulation performance, and are unable to handle significant fluctuations in signal levels associated with the incoming signal.

Accordingly, there is a need for a broadband receiver front end capable of being implemented in a cost-effective manner while achieving high levels of performance. There is a further need for such a receiver capable of handling significant fluctuations in signal levels associated with the received signals.

SUMMARY OF THE INVENTION

The present invention provides a fully differential receiver front end including a differential low noise amplifier and a transformer-based mixer for down-converting a radio frequency (RF) signal to an appropriate intermediate frequency (IF) signal or baseband signal in a direct conversion system. The receiver front end has exceptional second-order intermodulation performance, and may include circuitry providing a reduced gain in order to handle incoming signals having high signal levels. The receiver front end is very broadband and is able to cover multiple communication modes or bands using a common switching core in the mixer. The invention is also applicable to quadrature-based receiver front ends.

In one embodiment, a differential RF input signal drives the plus and minus terminals of a center tapped primary winding, which couples the differential RF input signal to the plus and minus terminals of a center tapped secondary winding. From the secondary winding, the coupled, differential RF signal drives a double-balanced mixer core operating in response to a differential local oscillator signal. The output of the mixer core is a differential IF signal representative of the differential RF input signal down-converted at the local oscillator frequency.

A step reduction in gain associated with the RF input signal may be implemented using bypass circuitry coupled across the primary of the transformer, wherein a relatively small resistance or impedance is coupled across the primary to effectively reduce the load of the differential amplifiers driving the primary. Preferably, the bypass circuitry is implemented such that both windings of the primary are treated equivalently. In one embodiment, opposingly configured PMOS or NMOS transistors are used to implement the bypass circuitry, such that when the opposing transistors are turned on, the effective channel resistance is applied across a primary of the transformer. In an alternative embodiment, a symmetrically structured multi-fingered MOS device may be used as or in association with the bypass circuitry to provide a reduced gain when the RF input signal is at a high level. The MOS device can be realized in either NMOS or PMOS.

In quadrature-based systems, an additional quadrature mixer may be implemented by placing the primary of a second transformer in parallel with the primary of the first transformer to derive the quadrature phase IF signals. Preferably, any step gain control is provided simultaneously to the primaries of both transformers, such that the in-phase and quadrature phase IF signals are treated consistently.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
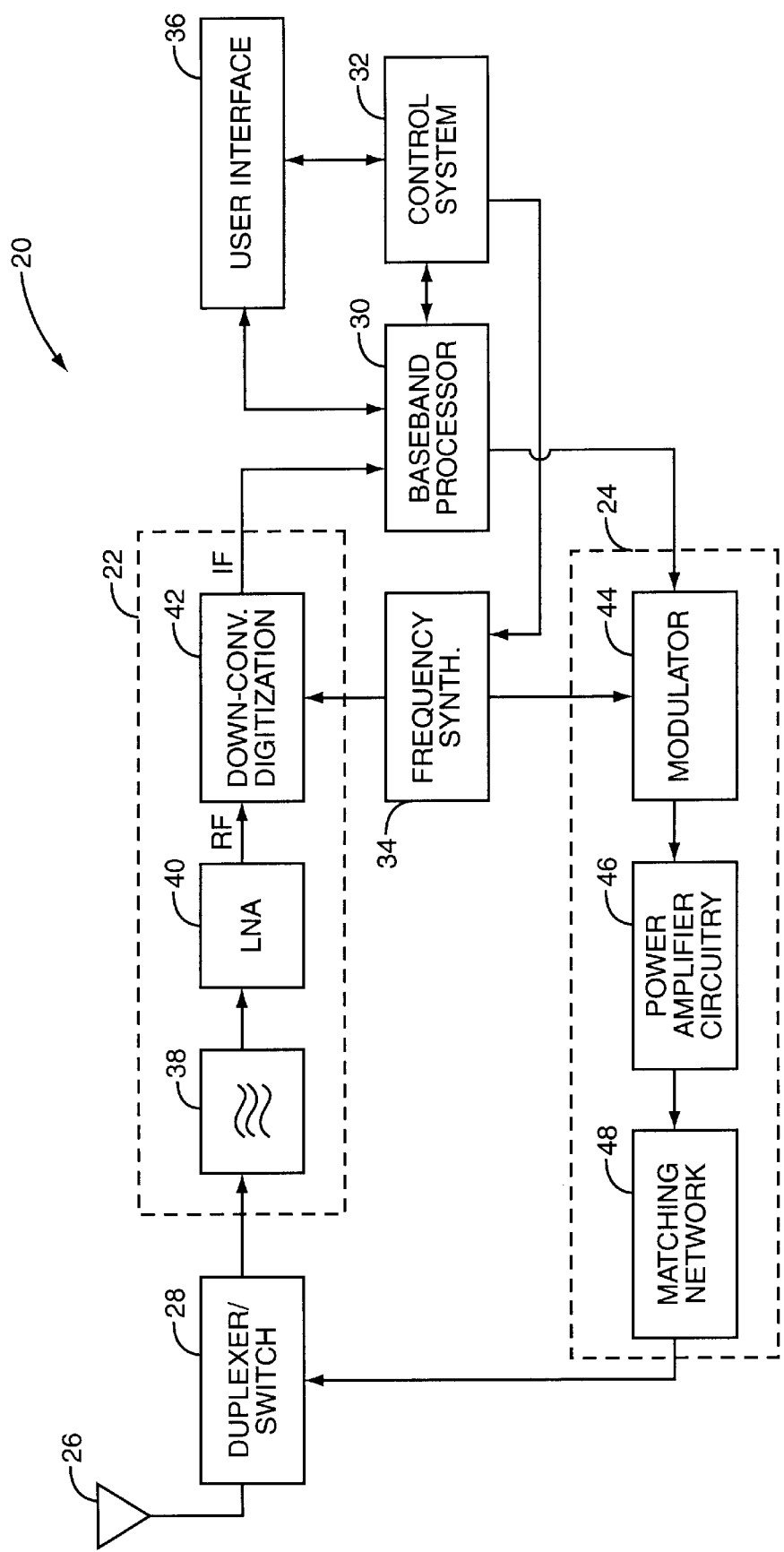
FIG. 1 is a block representation of a mobile terminal configured according to one embodiment of the present invention.

The present invention is preferably incorporated in a mobile terminal 20, such a mobile telephone, personal digital assistant, or the like. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and a user interface 36. The receiver front end 22 receives information bearing radio frequency (RF) signals from one or more remote transmitters provided by a base station (not shown). A filter 38 minimizes broadband interference in the received RF signal and a low noise amplifier (LNA) 40 pre-amplifies the filtered RF signal. The pre-amplified RF signal is then sent to a down-conversion and digitization circuitry 42, which down-converts the signal to one or more intermediate frequency (IF) signals and digitizes the IF signals into one or more digital streams for baseband processing. The receiver front end 22 typically uses one or more mixing frequencies generated by the frequency synthesizer 34.

The baseband processor 30 processes the digitized signals to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes or modulates for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission from the antenna 26. The amplified signal is sent to the duplexer or switch 28 and antenna 26 through a matching network 48.

A user may interact with the mobile terminal 20 via the interface 36, which may include interface circuitry associated with a microphone, speaker, keypad, and display. The interface circuitry typically includes analog-to-digital converters, digital-to-analog converters, amplifiers, and the like. Additionally, it may include a voice encoder/decoder, in which case it may communicate directly with the baseband processor 30.

Figure 2:
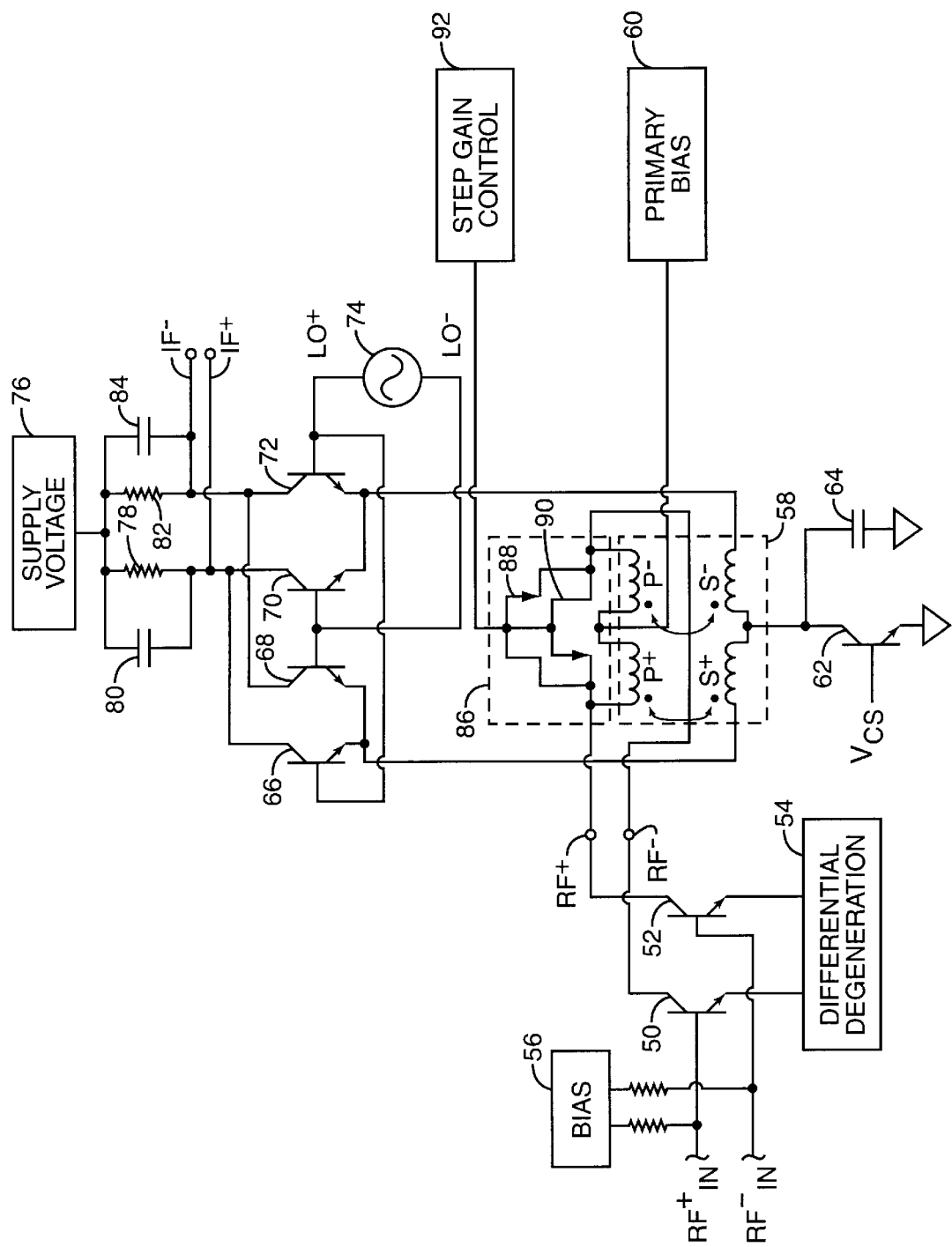
FIG. 2 is a schematic representation of a receiver front end architecture according to one embodiment of the present invention.

As illustrated in FIG. 2, the present invention provides a fully differential receiver front end section combining the functions of a low noise amplifier and a down-conversion mixer. The improved circuitry provides exceptional second-order intermodulation performance, and is capable of performing over a very broad band of frequencies, covering multiple frequency bands associated with different wireless communication technologies. As illustrated, a differential RF input signal ($RF^+_{IN}$ $RF^-_{IN}$) drives the bases of two transistors 50, 52, the emitters of which are controlled by differential degeneration circuitry 54. As those skilled in the art will appreciate, the differential degeneration circuitry 54 provides good common mode rejection, which enhances second order harmonic performance.

The differential version of $RF_{IN}$ appearing at the collectors of transistors 50, 52 is represented by signals $RF^+$ and $RF^-$. The $RF^+$ and $RF^-$ signals are coupled to opposing ends of two series-connected primary windings, $P^+$ and $P^-$ of a transformer 58. A DC supply voltage 60 is applied at center tapped primary transformer coil. The transformer 58 is preferably a completely balanced transformer having center-tapped primary and secondary windings, which form primary windings $P^+$ and $P^-$ and secondary windings $S^+$ and $S^-$. Preferably, the transformer 58 is a Balun transformer capable of being implemented directly in an integrated circuit containing all or a portion of the receiver front end circuitry.

At the junction of the two secondary windings $S^+$ and $S^-$, a center-tapped current sink is provided. The current sink is illustrated as a bi-polar transistor 62 capable of sinking a controlled amount of current. Preferably, a capacitor 64 couples the collector of transistor 62 to ground to provide a good AC ground, and a current sink control voltage, $V_{CS}$, is used to control current flow through transistor 62.

During operation, the differential signals $RF^+$ and $RF^-$ are coupled from the primary winding $P^+$ to the secondary winding $S^+$ and the primary winding $P^-$ to the secondary winding $S^-$. Although not illustrated, additional passive components may be consistently provided across any of the windings of transformer 58 in a manner controlling signal gain in traditional fashion.

The coupled $RF^+$ and $RF^-$ signals appearing across the secondary windings $S^+$ and $S^-$ are used to drive mixing circuitry comprised primarily of transistors 66–72. The coupled $RF^+$ signal appearing across the secondary winding $S^+$ drives the emitters of transistors 66 and 68. Similarly, the coupled $RF^-$ signal appearing across secondary winding $S^-$ drives the emitters of transistors 70 and 72. To mix the $RF^+$ and $RF^-$ signals with an appropriate local oscillator, differential local oscillator signals $LO^+$ and $LO^-$ are provided by local oscillator circuitry 74. The $LO^+$ signal drives the bases of transistors 66 and 72, while the $LO^-$ signal drives the bases of transistors 68 and 70 in a fully differential mixing topology. Mixing the coupled $RF^+$ and $RF^-$ signals with the $LO^+$ and $LO^-$ signals of the local oscillator provides a differential intermediate frequency output, consisting of $IF^+$ and $IF^-$ signals.

The collectors of transistors 66 and 70 are coupled to form the $IF^+$ output, and the collectors of transistors 68 and 72 are coupled to form the $IF^-$ output. Current is supplied to the mixing circuitry from a supply voltage 76 through a filter network. The filter network may include a resistor 78 and capacitor 80 in parallel with one another and coupling the collectors of transistors 66 and 70 to the supply voltage 76. Resistor 82 and capacitor 84 may be coupled in parallel with one another and between the collectors of transistors 68 and 72 and the supply voltage 76. The respective filter networks are configured to control the gain and frequency response of the mixing circuitry in traditional fashion. The load between the collectors of transistors 66, 68, 70, and 72 and the supply voltage 76 will vary depending on the desired intermediate frequency. For example, inductive loading may be required for higher intermediate frequencies.

The present invention provides an exceptionally well-balanced RF input to the mixer to enhance second-order intermodulation performance. Further, by the removal of a differential amplifier from the Gilbert cell-type mixer switching core, any performance limitations based on mismatched active components are significantly reduced through the use of passive fully differential transformer. Further, since the mixer core is driven in a differential manner directly from the secondary windings $S^+$ and $S^-$, there is additional headroom to allow greater signal swings, because the traditional LNA transistor amplifier circuitry is replaced with the transformer 58.

Given the ability of the receiver front end of the present invention to operate over very wide frequency bands supporting various communication technologies, the levels for received signals may vary greatly. Significant changes in the signal level of $RF_{IN}$ may result in gain compression as a result of transistors 50 and 52 approaching or entering saturation. Since the gains of transistors 50 and 52 are directly controlled by the impedance of the two primary coils P⁺ and P⁻ of transformer 58, the present invention provides bypass circuitry 86, which is capable of coupling a small resistance across the entire primary (P⁺ and P⁻) to reduce the load at the collectors of transistors 50 and 52. In the embodiment illustrated in FIG. 2, the small resistance coupled across the primary of transformer 58 is provided by two oppositely connected PMOS transistor switches 88 and 90. For example, if the primary of transformer 58 provides a load of 300 Ohms, a PMOS configuration for transistors 88 and 90 may provide a resultant load of 10 Ohms when the bypass circuitry is biased on, which would result in a stepped, gain reduction of 10 to 15 dB.

The gates of the transistor switched 88 and 90 are coupled together and controlled by step gain control circuitry 92, which may be provided by any type of control logic, including the control system 32. The source of transistor 88 and the drain of transistor 90 are coupled to one end of the primary winding, and the drain of transistor 88 and the source of transistor 90 are coupled to the other end of the primary winding. When the transistors 88 and 90 are biased off, a very high impedance is presented across the primary winding of the transformer 58 and the transistors 88 and 90 are effectively out of the circuit, wherein the gains of transistors 50 and 52 are controlled by the impedance of the primary winding of the transformer 58.

When a large signal is received, and the gain associated with transistors 50 and 52 must be reduced to maintain linear operation and avoid compression of RF⁺ and RF⁻, transistors 88 and 90 are simultaneously turned on to effectively short the primary of the transformer 58 with the channel resistance of the respective devices. In effect, the channel resistance of transistors 88 and 90 are placed in parallel with the entire primary of transformer 58, which effectively reduces the load applied to and the resultant gain associated with transistors 50 and 52. Thus, the gain for large signals is reduced so that the transistors 50 and 52 can operate in a linear fashion.

Figure 3:
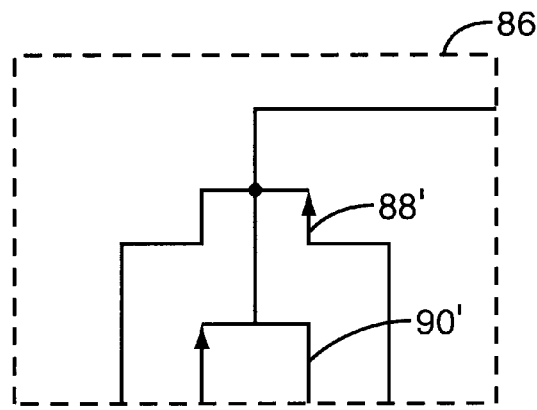
FIG. 3 is an alternative bypass circuit according to one embodiment of the present invention.

The amount by which the gain can be reduced is a function of the channel resistance. If the channel resistance of the PMOS transistors 88 and 90 illustrated in FIG. 2 is not low enough to adequately reduce gain, NMOS transistors, which typically have a lower channel resistance than PMOS transistors, may be used to provide greater step reduction in gain, as illustrated in FIG. 3 with transistors 88' and 90'. Those skilled in the art will recognize various ways in which to selectively bypass or switch in resistance across the primary winding of transformer 58 to achieve a desired reduction in the gain associated with transistors 50 and 52. Notably, the winding ratios for the primary and secondary windings of transformer 58 may vary depending on the desired gain. In the preferred embodiment, the primary and secondary windings have a winding ratio of 1:1; however, the ratios of P⁺ to S⁺ and P⁻ to S⁻ may vary wherein the effective number of turns for the secondary windings may be greater than those of the corresponding primary windings to add an effective amount of voltage gain.

Figure 4:
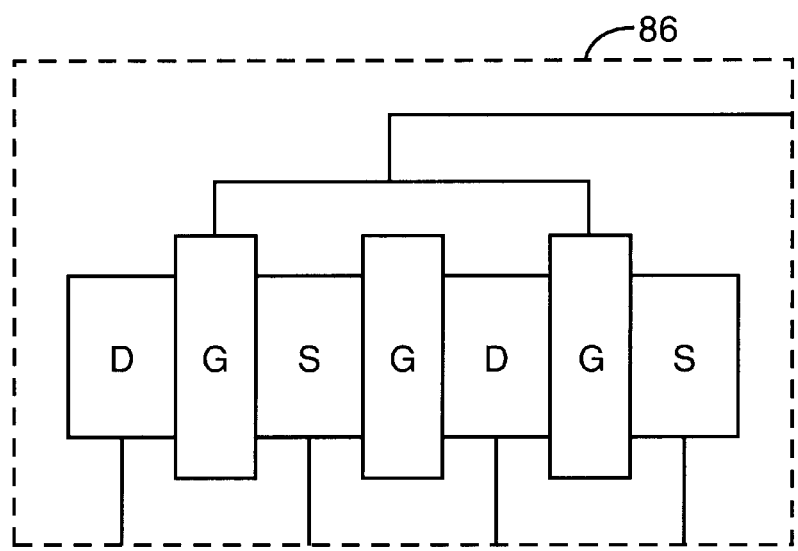
FIG. 4 is another alternative bypass circuit embodiment according to the present invention.

The transistors 88 and 90 are used in opposing fashion in an effort to maintain balance between the differential RF input signals, RF⁺ and RF⁻. Accordingly, using two transistors 88 and 90 and coupling them across the primary in an opposing fashion compensates for any variances in the effective impedance provided across the primary windings P⁺ and P⁻, and thus, the load provided to transistors 50 and 52. This differential structure helps balance any parasitic capacitors and resistance. Notably, the balanced implementation of transistors 88 and 90 may be implemented using a multi-finger or inter-digitated MOSFET device as illustrated in FIG. 4. Notably, in an effort to maintain balance across the primary channel resistances, the amount of drain area (D) and source area (S) are balanced. Those skilled in the art will recognize other techniques for providing a balanced load in parallel with the entire primary of the transformer 58.

Figure 5:
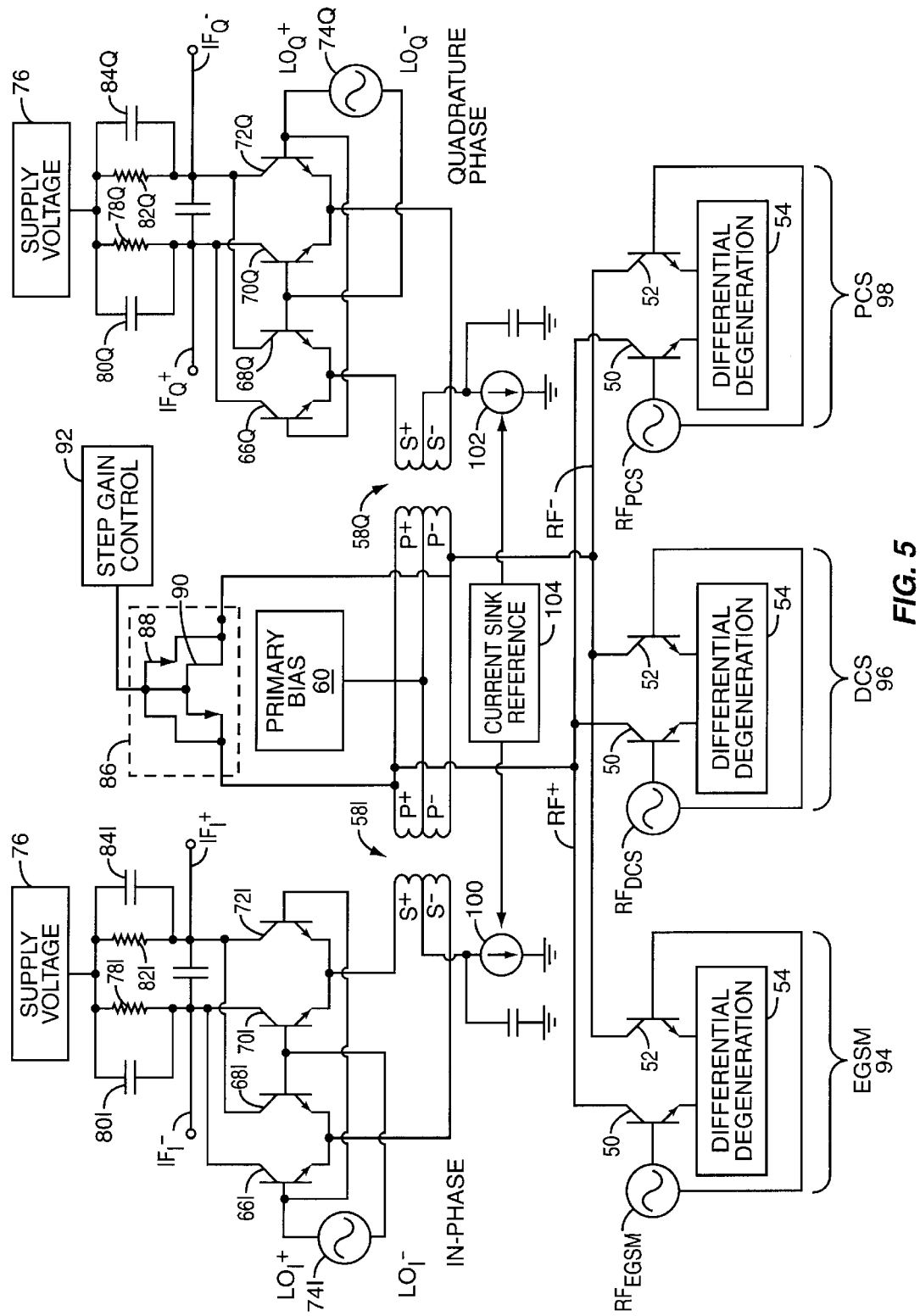
FIG. 5 is a schematic representation of a quadrature-based receiver front end architecture according to one embodiment of the present invention.

As illustrated in FIG. 5, the present invention may be incorporated into quadrature-based mixing systems. In the embodiment illustrated, the quadrature-based front end is capable of operating in three communication modes: EGSM, DCS, and PCS. Accordingly, the illustrated embodiment includes an in-phase mixing section and a quadrature phase mixing section, as well as three LNA sections, 94, 96, 98, corresponding to the EGSM, DCS, and PCS modes, respectively. Depending on the mode of operation, each of the LNAs 94, 96, 98 will receive the RF input signal $RF_{EGSM}$, $RF_{DCS}$, or $RF_{PCS}$, and generate a differential version of the signal using the corresponding transistors 50 and 52 and the differential degeneration circuitry 54, as described above. This concept can be extended to more than 3 bands and may be used to support any combination of bands.

In this quadrature mixing embodiment, there are two transformers 58I and 58Q, which both have center-tapped primary windings forming individual primary windings P⁺ and P⁻, respectively. These primary windings P⁺ and P⁻, including the center tap, for both transformers 58I and 58Q are coupled together. The supply voltage 60 provides bias to both primaries for each transformer 58I and 58Q. Transformers 58I and 58Q include secondary windings, which are center-tapped to form windings S⁺ and S⁻. The center taps for the secondaries of transformers 58I and 58Q are coupled to current sinks 100 and 102, respectively, which are driven by a common current sink reference 104.

As described above, the RF⁺ and RF⁻ signals are coupled from the P⁺ and P⁻ windings to the S⁺ and S⁻ windings, respectively, for each transformer 58I and 58Q. As such, the RF⁺ and RF⁻ signals are available to drive the in-phase and quadrature phase mixing cores.

Depending on the frequency needed for down-conversion, each mixing core will operate at a given local oscillator frequency; however, as in traditional quadrature fashion, the quadrature phase local oscillator frequency will operate 90 degrees out of phase from the in-phase local oscillator frequency. Accordingly, the quadrature phase local oscillator 74Q provides differential quadrature local oscillator signals $LO_Q^+$ and $LO_Q^-$, which are 90 degrees out of phase from the differential in-phase local oscillator signals $LO_I^+$ and $LO_I^-$ provided by the in-phase local oscillator 74I.

For in-phase mixing, the RF⁺ signal is coupled from the primary winding P⁺ to the secondary winding S⁺ of transformer 58I to drive the emitters of transistors 70I and 72I. The RF⁻ signal is coupled from primary winding P⁻ to the secondary winding S⁻ of transformer 58I to drive the emitters of transistors 66I and 68I. The local oscillator signal $LO_I^+$ drives the bases of transistors 66I and 72I, while the $LO_I^-$ signal drives the bases of transistors 68I and 70I. The collectors of transistors 66I and 70I are coupled together to provide the negative component of the differential intermediate frequency signal, $IF_I^-$ while the collectors of transistors 68I and 72I are coupled together to form the positive component of the differential in-phase intermediate frequency signal, $IF_I^+$. The collectors of transistors 66I and 70I are coupled to a supply voltage 76 via a network, illustrated as including resistor 78I and capacitor 80I in parallel.

Similarly, the collectors of transistors 68I and 72I are coupled to the supply voltage 76 via resistor 82I and capacitor 84I. Thus, the differential RF signals RF⁺ and RF⁻ are mixed with differential local oscillator signals $LO_I^+$ and $LO_I^-$ to provide differential intermediate frequency signals $IF_I^+$ and $IF_I^-$.

For quadrature phase mixing, the RF⁺ signal is coupled from the primary winding P⁺ to the secondary winding S⁺ of transformer 58Q to drive the emitters of transistors 70Q and 72Q. The RF⁻ signal is coupled from primary winding P⁻ to the secondary winding S⁻ of transformer 58Q to drive the emitters of transistors 66Q and 68Q. The $LO_Q^+$ signal drives the bases of transistors 66Q and 72Q, while the $LO_Q^-$ signal drives the bases of transistors 68Q and 70Q. The collectors of transistors 66Q and 70Q are coupled together to provide the negative component of the differential intermediate frequency signal, $IF_Q^-$ while the collectors of transistors 68Q and 72Q are coupled together to form the positive component of the differential quadrature phase intermediate frequency signal, $IF_Q^+$. The collectors of transistors 66Q and 70Q are coupled to a supply voltage 76 via a network, illustrated as including resistor 78Q and capacitor 80Q in parallel. Similarly, the collectors of transistors 68Q and 72Q are coupled to the supply voltage 76 via resistor 82Q and capacitor 84Q. Thus, the differential RF signals RF⁺ and RF⁻ are mixed with a differential local oscillator signals $LO_Q^+$ $LO_Q^-$ to provide differential intermediate frequency signals $IF_Q^+$ and $IF_Q^-$.

Gain control as described above can be provided to any of the LNAs 94, 96, 98, and is preferably applied equally to the primary and secondary windings of transformers 58I and 58Q, as illustrated. Thus, when the step gain control circuitry 92 controls the bypass circuitry 86 to turn on transistors 88 and 90, the channel resistances of the respective transistors are coupled across the primary windings of both transformers 58I and 58Q uniformly and simultaneously.

Those skilled in the art will recognize improvements and modifications to the preferred embodiments of the present invention. For example, the PNP-type, bipolar transistors may be used to form the mixing core of the mixing circuitry instead of NPN-type bipolar transistors. Further, the mixing core may be formed with various types of transistor technologies, including MOS. Accordingly, the transistors may be generically represented as having an input, bias control input, and output, which correspond to an emitter, base, and collector of an NPN-type bipolar transistor. All such improvements and modifications are considered within the scope of the concepts disclosed herein and the claims that follow.

What is claimed is:

1. A receiver front end comprising:
   a) a transformer comprising a primary formed from series connected first and second primary windings and a secondary formed from series connected first and second secondary windings, the primary having a center tap at a junction of the first and second primary windings for receiving a bias signal and the secondary having a center tap at a junction of the first and second secondary windings for sinking current;
   b) a differential radio frequency (RF) input having a first node operatively coupled to the first primary winding and a second node operatively coupled to the second primary winding; and
   c) differential mixing circuitry comprising:
      i) a differential input having a first node coupled to the first secondary winding and a second node coupled to the second secondary winding;
      ii) a differential local oscillator (LO) input; and
      iii) a differential intermediate frequency (IF) output,
   wherein a differential RF signal applied to the first and second primary windings is coupled to the differential input of the differential mixing circuitry via the first and second secondary windings and mixed with a differential local oscillator signal to provide a differential IF signal at the differential IF output.

2. The receiver front end of claim 1 further comprising amplifier circuitry for receiving an incoming signal and an output providing the differential RF signal, the output operatively coupled to the differential RF input.

3. The receiver front end of claim 2 further comprising bypass circuitry coupled across the primary of the transformer and adapted to selectively couple an impedance across the primary of the transformer to reduce an effective load appearing at the differential RF input and gain of the amplifier.

4. The receiver front end of claim 2 wherein the amplifier circuitry further comprises an input for receiving a differential input signal and differential degeneration circuitry to provide a good common rejection for the differential amplifier.

5. The receiver front end of claim 1 further comprising bypass circuitry coupled across the primary of the transformer and adapted to selectively couple an impedance across the primary of the transformer to reduce the effective load appearing at the differential RF input.

6. The receiver front end of claim 5 wherein the bypass circuitry includes two opposing transistor switches coupled across the primary and controlled by a step gain control signal, the impedance corresponding to the effective channel resistance of the two opposing transistor switches when operating in saturation under control of the step gain control signal.

7. The receiver front end of claim 6 wherein the two opposing transistors are PMOS transistors.

8. The receiver front end of claim 6 wherein the two opposing transistors are NMOS transistors.

9. The receiver front end of claim 5 wherein the bypass circuitry includes a multi-finger MOS transistor coupled across the primary and controlled by a step gain control signal, the impedance corresponding to the effective channel resistance of the multi-finger MOS transistor when operating in saturation under control of the step gain control signal.

10. The receiver front end of claim 1 further comprising a plurality of amplifier circuitries, each one of the plurality of amplifier circuitries adapted to receive an incoming signal for a given frequency band and output the differential RF signal, which corresponds to the given frequency band.

11. The receiver front end of claim 1 further comprising:
   a) a second transformer comprising;
      i) a primary formed from series connected first and second primary windings, which are coupled in parallel with the first and second primary windings of the first transformer, the primary having a center tap at a junction of the first and second primary windings for receiving the bias signal; and
      ii) a secondary formed from series connected first and second secondary windings, and the secondary having a center tap at a junction of the first and second secondary windings for sinking current; and
   b) quadrature differential mixing circuitry comprising:
      i) a quadrature differential input having a first node coupled to the first secondary winding and a second node coupled to the second secondary winding of the second transformer;

ii) a quadrature differential local oscillator (LO) input; and iii) a quadrature differential intermediate frequency (IF) output, wherein the differential RF signal is coupled to the quadrature differential input of the quadrature differential mixing circuitry via the first and second secondary windings of the second transformer and mixed with a quadrature differential local oscillator signal to provide a quadrature differential IF signal at the quadrature differential IF output.

12. The receiver front end of claim 11 further comprising a plurality of amplifier circuitries, each one of the plurality of amplifier circuitries adapted to receive an incoming signal for a given frequency band and output the differential RF signal, which corresponds to the given frequency band.

13. A receiver front end comprising:

a) a transformer comprising a primary having a first end, a center tap, and a second end forming series connected first and second primary windings and a secondary having a first end, a center tap, and a second end forming series connected first and second secondary windings;

b) a differential radio frequency (RF) input having a first node operatively coupled to the first end of the primary and a second node operatively coupled to the second end of the primary; and c) differential mixing circuitry comprising:

i) first, second, third, and fourth transistors wherein outputs of the first and second transistors are operatively coupled to the first end of the secondary and outputs of the third and fourth transistors are operatively coupled to the second end of the secondary;

ii) a differential local oscillator (LO) input having a first node operatively coupled to bias control inputs of the first and fourth transistors and a second node operatively coupled to bias control inputs of the second and third transistors; and iii) a differential intermediate frequency (IF) output having a first node operatively coupled to the outputs of the first and third transistors and a second node coupled to the outputs of the second and fourth transistors;

wherein a differential RF signal having a first component applied to the first end of the primary and a second component applied to the second end of the primary is coupled to the differential input of the differential mixing circuitry via the first and second secondary windings and mixed with a differential local oscillator signal to provide a differential IF signal at the differential IF output.

14. The receiver front end of claim 13 further comprising fifth and sixth transistors and differential degeneration circuitry wherein a single-ended RF input signal is operatively applied to bias control inputs of the fifth and sixth transistors; a output of the fifth transistor is operatively coupled to the first end of the primary and a output of the sixth transistor is operatively coupled to the second end of the primary via the differential RF input; and the degeneration circuitry is operatively coupled to inputs of the fifth and sixth transistors such that the degeneration circuitry drives the fifth and sixth transistors to provide the differential RF input signal at the differential RF input.

15. The receiver front end of claim 13 further comprising bypass circuitry coupled to the first and second ends of the primary and adapted to selectively couple an impedance across the primary of the transformer to reduce the effective load appearing at the differential RF input.

16. The receiver front end of claim 15 wherein the bypass circuitry includes two opposing transistor switches coupled across the primary and controlled by a step gain control signal, the impedance corresponding to the effective channel resistance of the two opposing transistor switches when operating in saturation under control of the step gain control signal.

17. The receiver front end of claim 16 wherein the two opposing transistors are first and second PMOS transistors having a source, gate, and drain, the source of the first PMOS transistor and the drain of the second PMOS transistor operatively coupled to the first end of the primary and the source of the second PMOS transistor and the drain of the first PMOS transistor operatively coupled to the second end of the primary.

18. The receiver front end of claim 16 wherein the two opposing transistors are first and second NMOS transistors having a source, gate, and drain, the source of the first NMOS transistor and the drain of the second NMOS transistor operatively coupled to the first end of the primary and the source of the second NMOS transistor and the drain of the first NMOS transistor operatively coupled to the second end of the primary.

19. The receiver front end of claim 15 wherein the bypass circuitry includes a symmetrically structured multi-finger NMOS or PMOS transistor coupled across the primary and controlled by a step gain control signal, the impedance corresponding to the effective channel resistance of the multi-finger MOS transistor when operating in saturation under control of the step gain control signal.

20. A receiver front end comprising:

a) first and second transformers each comprising a primary having a first end, a center tap, and a second end forming series connected first and second primary windings and a secondary having a first end, a center tap, and a second end forming series connected first and second secondary windings; the first ends, second ends, and center taps of the primaries for the first and second transformers being respectively coupled to one another;

b) a differential radio frequency (RF) input having a first node operatively coupled to the first ends of the primaries and a second node operatively coupled to the second ends of the primaries;

c) in-phase differential mixing circuitry comprising:

i) first, second, third, and fourth transistors wherein outputs of the first and second transistors are operatively coupled to the first end of the secondary of the first transformer and the outputs of the third and fourth transistors are operatively coupled to the second end of the secondary of the first transformer;

ii) an in-phase differential local oscillator (LO) input having a first node operatively coupled to bias control inputs of the first and fourth transistors and a second node operatively coupled to bias control inputs of the second and third transistors; and iii) an in-phase differential intermediate frequency (IF) output having a first node operatively coupled to the outputs of the first and third transistors and a second node coupled to the outputs of the second and fourth transistors; and d) quadrature differential mixing circuitry comprising:

i) fifth, sixth, seventh, and eighth transistors wherein outputs of the fifth and sixth transistors are operatively coupled to the first end of the secondary of the second transformer and outputs of the seventh and eighth transistors are operatively coupled to the second end of the secondary of the second transformer;

ii) a quadrature differential local oscillator (LO) input having a first node operatively coupled to bias control inputs of the fifth and eighth transistors and a second node operatively coupled to bias control inputs of the sixth and seventh transistors; and iii) a quadrature intermediate frequency (IF) output having a first node operatively coupled to the output of the fifth and seventh transistors and a second node coupled to the outputs of the sixth and eighth transistors.

21. The receiver front end of claim 20 further comprising ninth and tenth transistors and differential degeneration circuitry wherein a differential RF input signal is operatively applied to bias control inputs of the ninth and tenth transistors; a output of the ninth transistor is operatively coupled to the first ends of the primaries and a output of the tenth transistor is operatively coupled to the second ends of the primaries via the differential RF input; and the degeneration circuitry is operatively coupled to inputs of the ninth and tenth transistors such that the degeneration circuitry drives the ninth and tenth transistors to provide the differential RF input signal at the differential RF input.

22. The receiver front end of claim 20 further comprising bypass circuitry coupled to the first and second ends of the primaries and adapted to selectively couple an impedance across the primaries of the first and second transformers to reduce the effective load appearing at the differential RF input.

23. The receiver front end of claim 22 wherein the bypass circuitry includes two opposing transistor switches coupled across the primaries and controlled by a step gain control signal, the impedance corresponding to the effective channel resistance of the two opposing transistor switches when operating in saturation under control of the step gain control signal.

24. The receiver front end of claim 23 wherein the two opposing transistors are first and second PMOS transistors having a source, gate, and drain, the source of the first PMOS transistor and the drain of the second PMOS transistor operatively coupled to the first ends of the primaries and the source of the second PMOS transistor and the drain of the first PMOS transistor operatively coupled to the second ends of the primaries.

25. The receiver front end of claim 23 wherein the two opposing transistors are first and second NMOS transistors having a source, gate, and drain, the source of the first NMOS transistor and the drain of the second NMOS transistor operatively coupled to the first ends of the primaries and the source of the second NMOS transistor and the drain of the first NMOS transistor operatively coupled to the second ends of the primaries.

26. The receiver front end of claim 22 wherein the bypass circuitry includes a multi-finger MOS transistor coupled across the primaries of the first and second transformers and controlled by a step gain control signal, the impedance corresponding to the effective channel resistance of the multi-finger MOS transistor when operating in saturation under control of the step gain control signal.

27. The receiver front end of claim 20 further comprising a first current sink coupled to the center tap of the secondary of the first transformer and a second current sink coupled to the center tap of the secondary of the second transformer.

28. The receiver front end of claim 27 further comprising a common current sink reference for controlling both the first and second current sinks.

* * * * *